(12) United States Patent
Park

(10) Patent No.: US 8,193,025 B2
(45) Date of Patent: Jun. 5, 2012

(54) PHOTOMASK, IMAGE SENSOR, AND METHOD OF MANUFACTURING THE IMAGE SENSOR

(75) Inventor: Jin Ho Park, Youngju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 889 days.

(21) Appl. No.: 12/241,263

(22) Filed: Sep. 30, 2008

(65) Prior Publication Data

US 2009/0152660 A1 Jun. 18, 2009

(30) Foreign Application Priority Data

Dec. 17, 2007 (KR) .................. 10-2007-0132394

(51) Int. Cl.
*H01L 21/00* (2006.01)

(52) U.S. Cl. ................... 438/69; 438/48; 438/65

(58) Field of Classification Search .......... 438/48, 438/65, 69
See application file for complete search history.

(56) References Cited

U.S. PATENT DOCUMENTS 7,280,278 B2 * 10/2007 Boettiger et al. ............ 359/619
7,723,147 B2 * 5/2010 Yun et al. .................... 438/65
7,829,370 B2 * 11/2010 Ryu ............................. 438/70

FOREIGN PATENT DOCUMENTS

JP 2007-305867 11/2007
KR 10-2008-0060450 7/2008

* cited by examiner

*Primary Examiner* — Douglas Menz
(74) *Attorney, Agent, or Firm* — Saliwanchik, Lloyd & Eisenschenk

(57) ABSTRACT

Provided are a photomask, an image sensor, and a method of manufacturing the image sensor. The image sensor can include photodiode structures, color filters, a planarization layer, and microlenses. The photodiode structures can be disposed on a semiconductor substrate according to unit pixel. The color filters can be disposed on the semiconductor substrate in a matrix arrangement above the photodiode structures. The planarization layer can cover the entire semiconductor substrate and includes cavities in regions of the planarization layer corresponding to boundaries between the color filters. The cavities may be arranged at boundaries between unit pixels. The microlenses can be disposed on the planarization layer such that portions of the microlenses are arranged in the cavities of the planarization layer.

10 Claims, 6 Drawing Sheets

PHOTOMASK, IMAGE SENSOR, AND METHOD OF MANUFACTURING THE IMAGE SENSOR

CROSS-REFERENCE TO RELATED APPLICATION

The present application claims the benefit under 35 U.S.C. §119 of Korean Patent Application No. 10-2007-0132394, filed on Dec. 17, 2007, which is hereby incorporated by reference in its entirety.

BACKGROUND

An image sensor is a semiconductor device for converting an optical image into an electrical signal. The image sensor is generally classified as a charge coupled device (CCD) image sensor or a complementary metal oxide semiconductor (CMOS) image sensor (CIS).

A unit pixel of the CIS typically includes a photodiode and a metal oxide semiconductor (MOS) transistor. In operation, the CIS sequentially detects an electrical signal of the unit pixel in a switching manner to generate an image.

To improve the optical sensitivity of the image sensor, a method of increasing the fill factor of the image sensor or concentrating light incident to other regions except for the photodiode onto the photodiode is used.

One such method for concentrating light involves forming a microlens.

According to a related art, the process for forming a microlens in a manufacturing method for an image sensor typically includes a micro photo process using a photoresist for a microlens followed by a reflowing process to create convex shaped microlenses.

However, when reflowing the photoresist, an amount of the photoresist removed, generating gaps between microlenses. Thus, the amount of light incident to the photodiode decreases, causing a defective image.

Also, since corners of the microlenses (such as at an intersection of adjacent portions of four lenses) are rounded by various causes, the gaps occur between the adjacent microlenses.

FIGS. 1 and 2 are images illustrating photoresist patterns 50a for forming microlenses and the resulting microlenses 50b formed by reflowing the photoresist patterns 50a by heat according to a related art.

Light incident between rounded corners of the microlenses 50b may disappear, thereby degrading the sensitivity of an image sensor. When the four microlenses 50b are arranged in a matrix shape, a large opening occurs between the microlenses 50b. Thus, light penetrating through the opening may not be properly incident to the photodiode, considerably degrade the quality of an image.

BRIEF SUMMARY

Embodiments of the present invention provide a photomask, an image sensor, and a method of manufacturing the image sensor that can improve a sensitivity of the image sensor. Embodiments of the present invention can improve the sensitivity by improving a corner-rounding phenomenon of a microlens for an image sensor.

In one embodiment, a photomask is provided that comprises: light-transmitting portions on a transparent substrate, the light-transmitting portions being disposed in a matrix and each light-transmitting portion corresponding to a wafer die for an image sensor; and a light-blocking portion at the boundaries between the light-transmitting portions. Each light-transmitting portion includes light-blocking patterns spaced apart a predetermined distance from each other. The photomask can be used to create patterns for cavity regions formed under microlenses of an image sensor.

In another embodiment, an image sensor is provided that comprises: a photodiode structure on a semiconductor substrate; color filters on the semiconductor substrate, the color filters being disposed in a matrix shape; a planarization layer covering an entire surface of the semiconductor substrate and comprising a cavity in a portion of the planarization layer corresponding to a boundary of the color filters; and microlenses on the planarization layer, wherein a corner portion of selected microlenses are on a region of the cavity of the planarization layer. The microlenses can be provided corresponding to the color filters such that a corner portion of four adjacent microlenses are formed on the region of the cavity. In certain embodiments, the cavities can be formed at boundaries of unit pixels and the microlenses can be provided according to unit pixel such that a portion of each microlens is in a portion of a cavity.

In yet another embodiment, a method of manufacturing an image sensor is provided that comprises: forming a photodiode structure on a semiconductor substrate; forming color filters on the semiconductor substrate; forming a planarization layer on the color filters; forming cavities in the planarization layer, the cavities being spaced a predetermined distance from each other; forming photoresist patterns overlapping portions of the cavities, the photoresist patterns formed on regions corresponding to the color filters; and heat-treating the photoresist patterns to form microlenses.

According to embodiments, excess corner-rounding of a microlens in an image sensor is reduced to maximize optical efficiency of the microlenses.

According to certain implementations, a small-sized photodiode can be effectively manufactured while having excellent optical efficiency by decreasing the gaps between microlenses. Thus, improved miniaturization and integration for devices can be achieved.

Also, according to embodiments, the corner-rounding of the microlenses is reduced to increase the fill factor of the photodiode and inhibit light from being incident to regions other than for the photodiode to reduce noise.

The details of one or more embodiments are set forth in the accompanying drawings and the description below. Other features will be apparent from the description and drawings, and from the claims.

DETAILED DESCRIPTION

Figure 1:
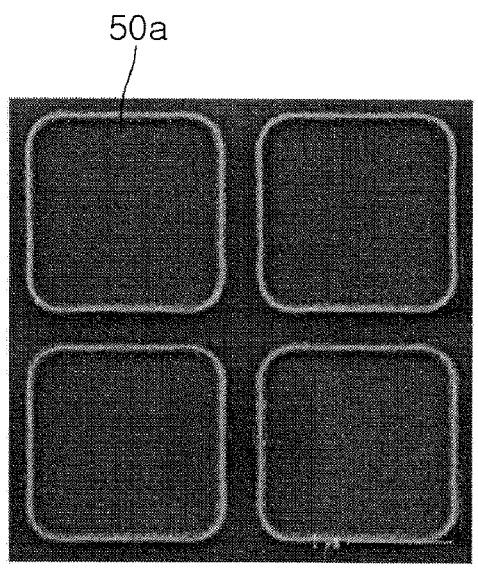
FIG. 1 shows an image illustrating photoresist patterns for forming microlenses in accordance with a related art.

Hereinafter, a photomask and an image sensor according to embodiments will now be described in detail with reference to the accompanying drawing. It should be understood that numerous other additions, deletions, modifications, and embodiments can be devised by those skilled in the art that will fall within the spirit and scope of the principles of this disclosure.

In addition, it will also be understood that when the terms like "first" and "second" are used to describe members, the members are not limited by these terms. For example, a plurality of members may be provided. Therefore, when the terms like "first" and "second" are used, it will be apparent that a plurality of members may be provided. In addition, the terms "first" and "second" can be selectively or exchangeably used for the members. In the figures, a dimension of each of elements is exaggerated for clarity of illustration, and the dimension of each of the elements may be different from an actual dimension of each of the elements. Not all elements illustrated in the drawings must be included and limited to the present disclosure, but the elements except essential features of the present disclosure may be added or deleted.

In the description of embodiments, it will be understood that when a layer (or film), region, pattern, or structure is referred to as being 'on/above/over' another substrate, layer (or film), region, pad, or pattern, it can be directly on the another substrate, layer (or film), region, pad, or pattern, or an intervening layer (or film), region, pad, pattern, or structure may also be present. Further, it will be understood that when a layer (or film), region, pattern, or structure is referred to as being 'down/below/under' another substrate, layer (or film), region, pad, or pattern, it can be directly under the another substrate, layer (or film), region, pad, or pattern, or an intervening layer (or film), region, pad, pattern, or structure may also be present. Therefore, the meanings of the terms are determined according to the spirit and scope of embodiments.

Figure 3:
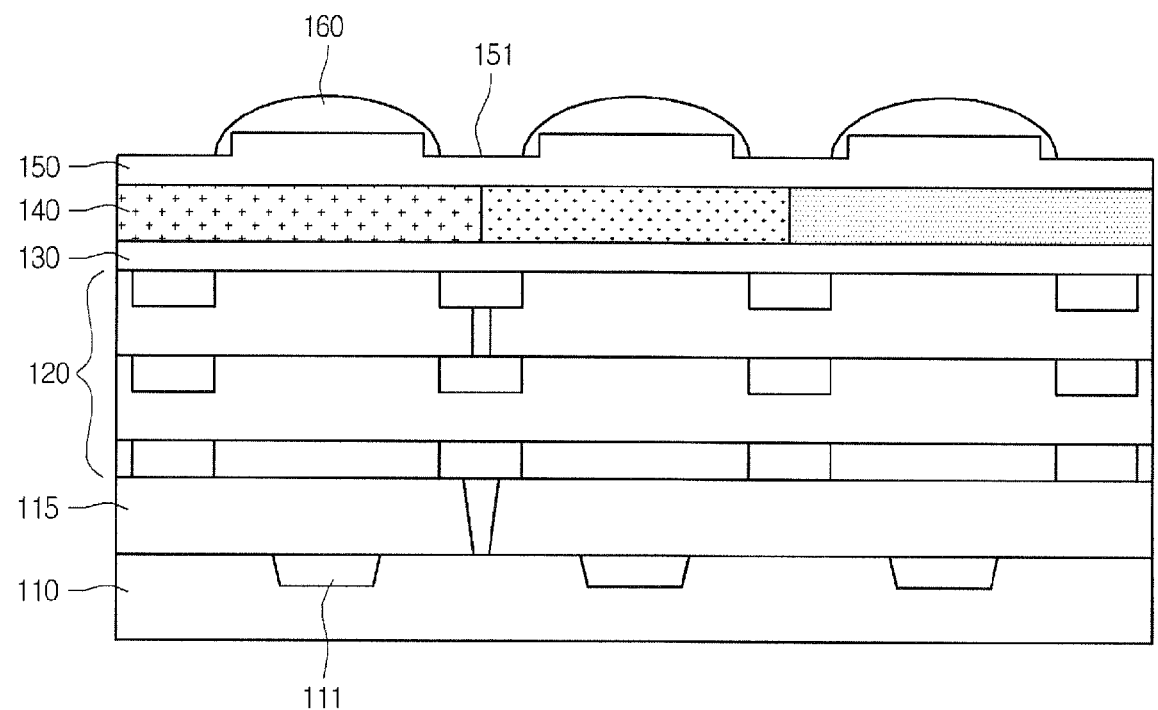
FIG. 3 is a cross-sectional view illustrating an image sensor according to an embodiment of the present invention.

FIG. 3 is a cross-sectional view of an image sensor according to an embodiment.

Referring to FIG. 3, in certain embodiments, the image sensor can include a dielectric 115 on a semiconductor substrate 110 including a photodiode 111, a multi-layered metal interconnection layer 120 including a metal interconnection on the dielectric 115, and a passivation layer 130 and a color filter array layer 140 on the metal interconnection layer 120. A planarization layer 150 can be disposed on the color filter array layer 140.

According to embodiments, the planarization layer 150 includes cavities 151 on regions corresponding to boundaries between color filters.

A cavity 151 of the planarization layer 150 can have a planar polygonal or circular shape. For example, the cavity 151 can have a diamond shape (see FIG. 4).

Microlenses 160, each corresponding to a unit pixel, can be formed on the planarization layer 150 and a portion of the cavities 151.

An edge of a microlens 160 covers a portion of the cavity 151. That is, the microlens 160 can be formed on a portion along a side wall in the cavity 151.

Figure 4:
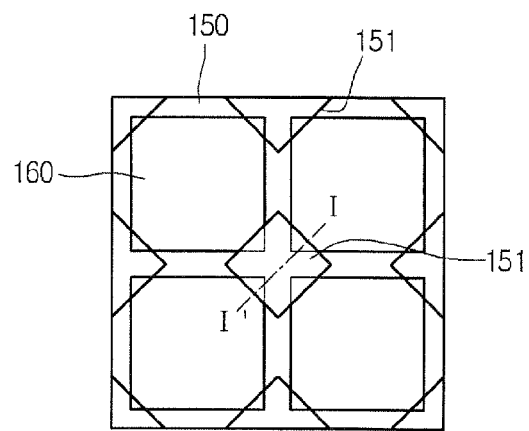
FIG. 4 is a plan view illustrating four microlenses of an image sensor according to an embodiment of the present invention.
Figure 5:
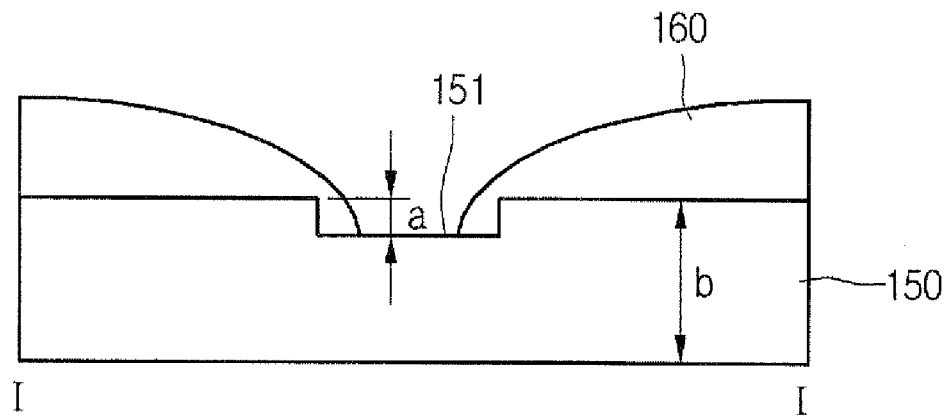
FIG. 5 is a cross-sectional view according to an embodiment of the present invention taken along a line I-I' of FIG. 4.

FIG. 4 is a plan view illustrating a region of an image sensor showing four adjacent microlenses 160 according to an embodiment. FIG. 5 is a cross-sectional view taken along a line I-I' of FIG. 4.

Referring to FIGS. 4 and 5, the four microlenses 160 are arranged in a matrix formation where each microlens 160 corresponds to a unit pixel.

A cavity 151 is provided in the planarization layer 150 in a region between where the four microlenses 160 are to be formed.

The adjacent corners of the four microlenses 160 overlap a portion of the cavity 151.

In one embodiment, the cavity 151 can have a depth 'a' ranging from about 800 Å to about 1200 Å. In addition, the planarization layer 150 can have a depth 'b' ranging from about 2000 Å to about 6000 Å.

The cavity 151 can have, for example, a tetragonal or diamond shape having four sides respectively corresponding to the corners of the adjacent four microlenses 160.

Corners of the cavity 151 may be rounded during formation by an optical phenomenon including the diffraction of light irradiated to a photoresist layer when patterning the planarization layer 150 to form the cavity 151. In many embodiments, a photomask as described herein can be used to form the cavity 151.

Since the microlenses 160 overlap portions of the cavity 151, the corners of the microlenses 160 are inhibited from being reduced by excess rounding during the reflowing of photoresist patterns to form the microlenses 160.

That is, the surface area of the microlenses 160 can be inhibited from being reduced during the reflowing process because of the portions of the microlens photoresist patterns that remain in the cavity 151, and the excess corner-rounding of the microlenses 160 can also be inhibited.

Figure 6:
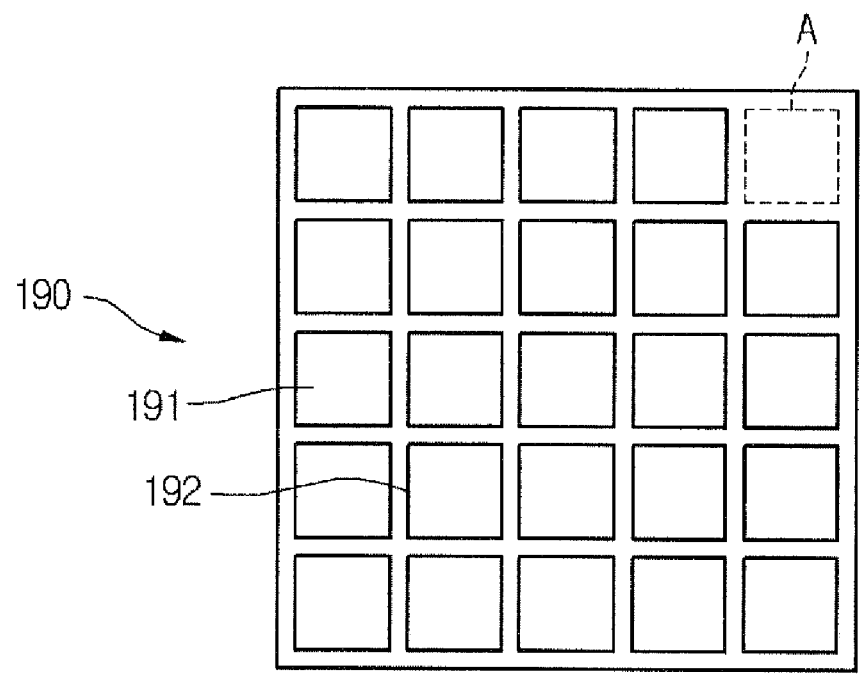
FIG. 6 is a plan view illustrating a photomask for forming a planarization layer according to an embodiment of the present invention.
Figure 7:
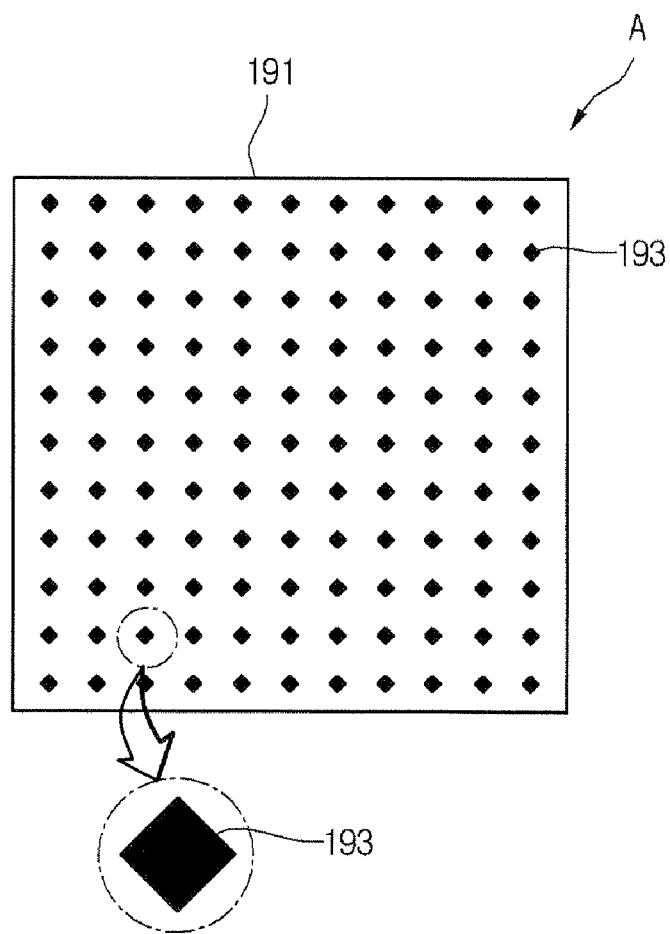
FIG. 7 is an enlarged view illustrating a region 'A' of the photomask of FIG. 6 according to an embodiment of the present invention.

FIG. 6 is a plan view illustrating a photomask 190 for forming cavities in a planarization layer according to an embodiment. FIG. 7 is an enlarged view illustrating a region 'A' of the photomask of FIG. 6.

Referring to FIGS. 6 and 7, the photomask 190 includes light-transmitting portions 191 and a light-blocking portion 192 on a transparent substrate. The light-transmitting portion 191 may correspond to a die A of a wafer.

A plurality of unit pixels can be disposed in each die A. A mask pattern 193 is disposed in the light-transmitting portion 191 in order to form a cavity pattern on the planarization layer corresponding to a position between four adjacent unit pixels.

In one embodiment, the mask pattern 193 can be a chrome pattern. According to embodiments, the mask patterns 193 can each have a tetragonal or diamond shape.

The mask pattern 193 can be disposed to correspond to a position between four adjacent unit pixels.

To form the aforementioned cavity 151 in the aforementioned planarization layer 150, a negative photoresist layer can be provided on the planarization layer 150, then a selective exposure process using the photomask 190 can be performed. Then, a development process can be performed with respect to the exposed photoresist layer to form an opened photoresist pattern corresponding to the position of the cavity 151.

The cavity 151 can then be formed by etching the planarization layer 150 using the photoresist pattern as a mask.

FIGS. 8 to 11 are cross-sectional views illustrating a method of forming a microlens of an image sensor according to an embodiment.

Figure 8:
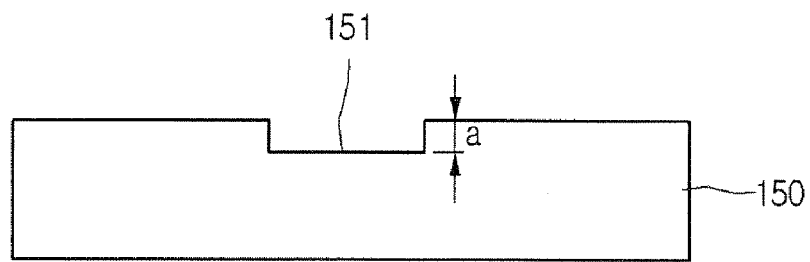
FIGS. 8 to 11 are cross-sectional views for illustrating a method of forming a microlens of an image sensor according to an embodiment of the present invention.

Referring to FIG. 8, a cavity 151 having a predetermined depth 'a' can be formed in a planarization layer 150 between unit pixels using a photomask such as that illustrated in FIGS. 6 and 7.

The cavity 151 can be formed to correspond to a region between four adjacent unit pixels. The cavity 151 can be formed to have a diamond shape. Of course, it should be noted that the corners of the diamond shape may have rounded edges.

Figure 9:
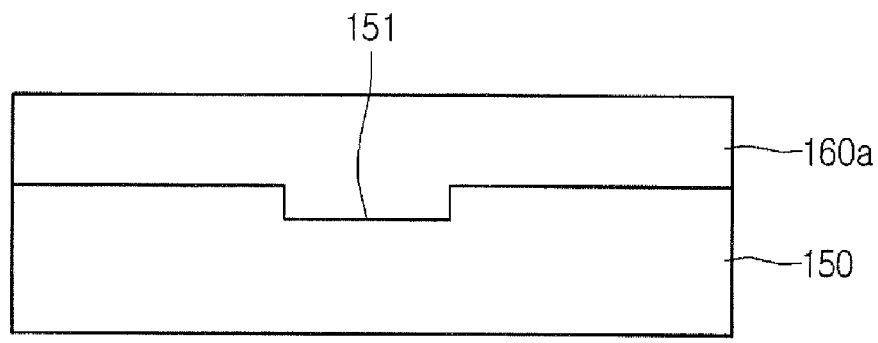

Referring to FIG. 9, a photoresist layer 160a for forming a microlens can be formed on the planarization layer 150 including the cavity 151.

The photoresist layer 160a can be a positive photoresist layer in which a portion exposed to light is removed.

Figure 10:
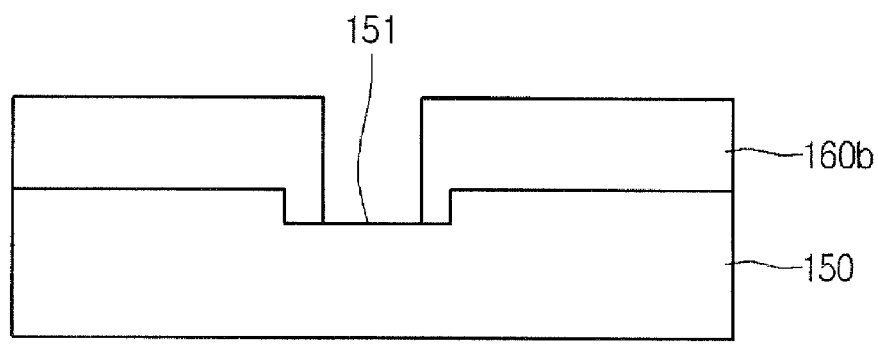

Referring to FIG. 10, the photoresist layer 160a is selectively exposed to light and developed to form a photoresist pattern 160b corresponding to the respective unit pixels. The opened region between photoresist patterns 160b can be shaped as a cross through the cavity 151 such that corners of photoresist patterns 160b overlap sides of the cavity 151.

Although only two photoresist patterns 160b are shown in FIG. 10, the photoresist patterns 160b can be arranged in a matrix formation. Corners of four adjacent photoresist patterns 160b are formed in the cavity 151 provided between the four photoresist patterns 160b.

Figure 11:
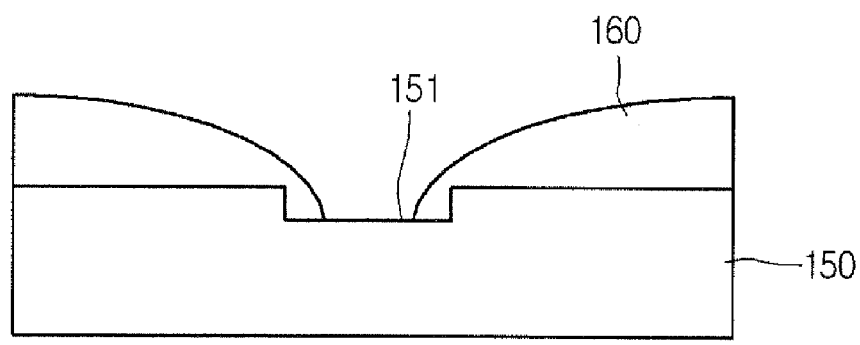

Referring to FIG. 11, a reflowing process can be performed by applying heat to the photoresist patterns 160b such that microlenses 160 having a dome shape can be formed.

Edges of the microlenses 160 can be formed in a portion of the cavity 151 along sidewalls of the cavity 151.

That is, since the photoresist patterns 160b are formed having a portion in the cavity 151, an excess corner-rounding phenomenon can be substantially reduced during the reflowing process. Thus, when the four microlenses 160 are arranged in a matrix shape, a gap can be substantially inhibited from occurring in the middle of the four adjacent microlenses 160. Accordingly, the amount of light incident to a photodiode can be increased and current leakage can be reduced, improving image quality.

Figure 12:
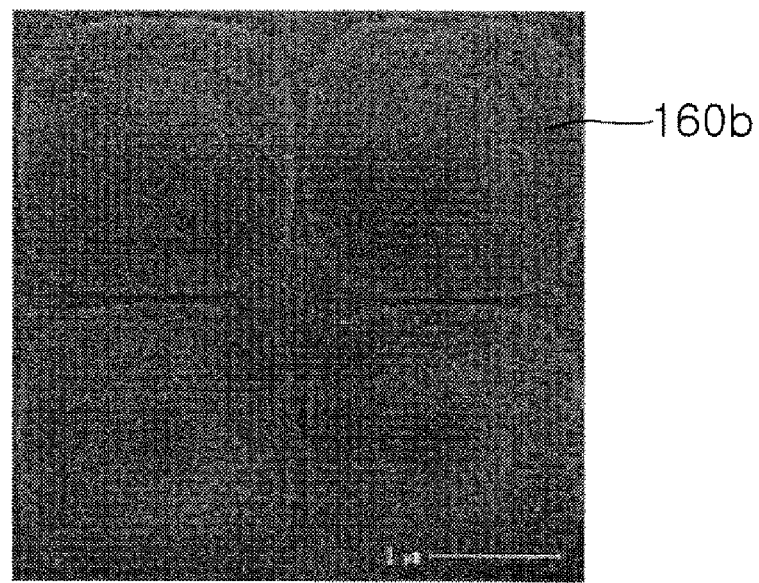
FIG. 12 shows an image illustrating photoresist patterns of an image sensor in accordance with an embodiment of the present invention.
Figure 13:
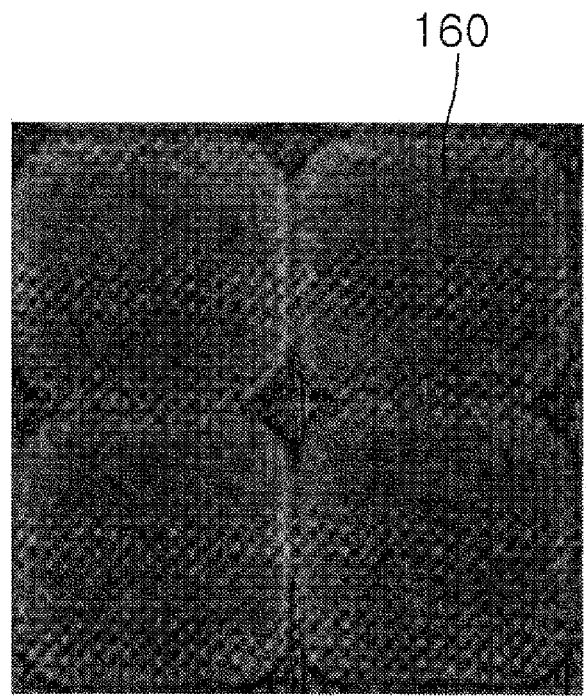
FIG. 13 shows an image illustrating the resulting microlenses formed by reflowing the photoresist patterns of FIG. 12 according to an embodiment of the present invention.

FIGS. 12 and 13 are images illustrating photoresist patterns 160b of an image sensor and the resulting microlenses 160 formed by reflowing the photoresist patterns 160b according to an embodiment.

Figure 2:
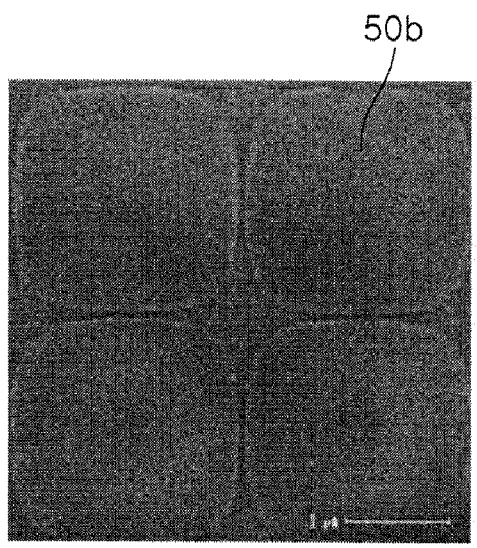
FIG. 2 shows an image illustrating the resulting microlenses formed by reflowing the photoresist patterns of FIG. 1 according to a related art.

Referring to FIGS. 12 and 13, it can be seen that, compared to the images of a related art image sensor shown in FIGS. 1 and 2, a corner-rounding is substantially reduced in the region between four adjacent photoresist patterns 160b, and gaps between the microlenses 160 are reduced to increase surface areas.

Thus, according to embodiments, the corner-rounding of the microlenses in the image sensor can be reduced, maximizing optical efficiency.

According to embodiments, the small-sized photodiode can be effectively manufactured while maintaining excellent optical efficiency by decreasing the gaps between the microlenses. Therefore, improved miniaturization and integration for devices can be achieved.

Also, according to embodiments, the corner-rounding of the microlenses is reduced to increase the fill factor of the photodiode, and light is inhibited from being incident to regions other than the photodiode to reduce noise.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing an image sensor, the method comprising:
   forming a photodiode structure arranged by unit pixel on a semiconductor substrate;
   forming a planarization layer on the semiconductor substrate including the photodiode structure;
   forming cavities in the planarization layer, the cavities being spaced apart by a predetermined distance from each other;
   forming photoresist patterns on the planarization layer overlapping portions of the cavities, wherein each of the photoresist patterns includes a first portion and a second portion, wherein the first portion is disposed in the cavities and the second portion is disposed out of the cavities; and
   heat-treating the photoresist patterns to form microlenses.

2. The method according to claim 1, wherein the planarization layer has a thickness ranging from about 2000 Å to about 6000 Å.

3. The method according to claim 2, wherein the forming of the cavities in the planarization layer comprises selectively etching the planarization layer to form the cavities having a depth ranging from about 800 Å to about 1200 Å.

4. The method according to claim 1, wherein the forming of the cavities in the planarization layer comprises:
   forming a first photoresist on the planarization layer;
   arranging a photomask above the planarization layer, the photomask comprising: a plurality of light-transmitting portions arranged in a matrix formation on a transparent substrate, each the light-transmitting portion corresponding to a wafer die for the semiconductor substrate; and a light-blocking portion provided at boundaries between light-transmitting portions of the plurality of light-transmitting portions, wherein each light-transmitting portion comprises a plurality of light-blocking patterns spaced apart by a predetermined distance from each other and corresponding to the cavities;
   exposing the first photoresist to light through the photomask;
   developing the exposed photoresist to form first photoresist patterns;
   etching the planarization layer using the first photoresist patterns as a mask; and
   removing the first photoresist patterns.

5. The method according to claim 1, wherein forming photoresist patterns on the planarization layer overlapping portions of the cavities comprises:
   overlapping a cavity disposed in a region between four adjacent microlenses with a portion of each of the four adjacent microlenses.

6. The method according to claim 1, wherein the photoresist patterns are formed of a positive photoresist.

7. The method according to claim 1, wherein forming the photoresist patterns comprise forming a portion of each photoresist pattern in a portion of a selected cavity of the cavities along a sidewall in the selected cavity.

8. The method according to claim 1, wherein the cavities are formed to have a tetragonal pattern.

9. The method according to claim 8, wherein the tetragonal pattern comprises four sides, and wherein the four sides of the tetragonal pattern correspond to corners of four adjacent microlenses.

10. The method according to claim 1, wherein each of the photoresist patterns contacts with a bottom surface and a side surface of the cavities.

* * * * *